United States Patent
Huang et al.

(10) Patent No.: US 8,605,525 B2
(45) Date of Patent: Dec. 10, 2013

(54) SYSTEM AND METHOD FOR TESTING FOR DEFECTS IN A SEMICONDUCTOR MEMORY ARRAY

(75) Inventors: Yin Chin Huang, Zhubei (TW); Chu Pang Huang, Hsinchu (TW); Cheng Chi Liu, Shulin (TW); Min Kuang Li, Keelung (TW); Chang Chan Yang, Zhubei (TW); Yi Fang Chang, Pingjhen (TW)

(73) Assignee: Macronix International Co., Ltd. (TW)

( * ) Notice: Subject to any disclaimer, the term of this patent is extended or adjusted under 35 U.S.C. 154(b) by 405 days.

(21) Appl. No.: 12/953,213

(22) Filed: Nov. 23, 2010

(65) Prior Publication Data

US 2012/0127797 A1 May 24, 2012

(51) Int. Cl.
*G11C 7/00* (2006.01)
(52) U.S. Cl.
USPC .............. 365/201; 365/200; 365/185.22
(58) Field of Classification Search
USPC ..................... 365/200, 201, 185.22
See application file for complete search history.

(56) References Cited

U.S. PATENT DOCUMENTS

| 5,144,167 | A | 9/1992 | McClintock | |
|---|---|---|---|---|
| 5,313,432 | A * | 5/1994 | Lin et al. | 365/185.06 |
| 7,606,109 | B2 * | 10/2009 | Im | 365/230.06 |
| 2001/0048621 | A1 * | 12/2001 | Brass et al. | 365/200 |
| 2005/0052908 | A1 * | 3/2005 | Tomoeda et al. | 365/185.29 |
| 2006/0126397 | A1 * | 6/2006 | Tanishima | 365/185.29 |

* cited by examiner

*Primary Examiner* — Vu Le
*Assistant Examiner* — Han Yang
(74) *Attorney, Agent, or Firm* — Baker & McKenzie LLP (57) ABSTRACT

A system and method for testing semiconductor memory devices includes a variable voltage input to a memory cell control gate. The voltage to the control gate can be varied from a voltage level used for normal memory cell operation, such as a read operation, to a voltage level that can be used to detect a defect in the memory device. During testing, the voltage level applied to the control gate is lower than the voltage level applied to a second terminal, such as a drain terminal, of the memory cell. In some embodiments, testing for defects can include applying a negative voltage to the control gate, while a positive voltage is applied to the drain terminal, which can reveal the presence of a gate-to-drain leakage defect.

5 Claims, 7 Drawing Sheets

SYSTEM AND METHOD FOR TESTING FOR DEFECTS IN A SEMICONDUCTOR MEMORY ARRAY

BACKGROUND

1. Technical Field

The present application relates generally to semiconductor memory devices, and more particularly to test systems and methods for detecting transistor defects in semiconductor memory devices.

2. Related Art

Electronic memory devices are well known and commonly found in a variety of electronic systems. For example, electronic memory devices (sometimes referred to as computer memory) can be found in computers and other computing devices. Various removable or stand-alone electronic memory devices are also known, such as memory cards or solid-state data storage systems. For example, it is known to use a removable memory card for storing pictures on a digital camera or for storing movies recorded with a digital video recorder.

Most electronic memory devices can be classified as either volatile or nonvolatile. A volatile electronic memory device is, in general, one which requires power in order to maintain the stored information. An example of a volatile electronic memory device is a Static Random Access Memory (SRAM) or Dynamic Random Access Memory (DRAM) computer memory device, which only retains the stored data while the computer is on, and which loses the stored data when the computer is turned off or otherwise loses power. In contrast, a nonvolatile electronic memory device is, in general, one which is capable of retaining stored data in the absence of an external power source. An example of a nonvolatile memory is a Flash memory. The two main types of Flash memory are the NOR Flash and the NAND Flash.

Figure 1:
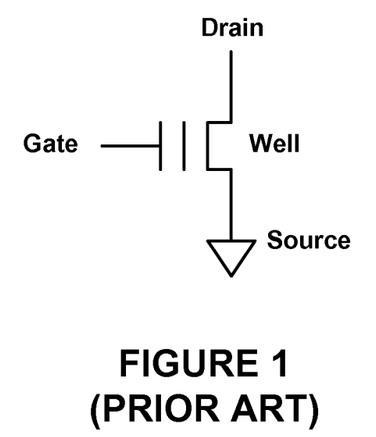
FIG. 1 shows a schematic view of a conventional floating gate transistor.
Figure 2:
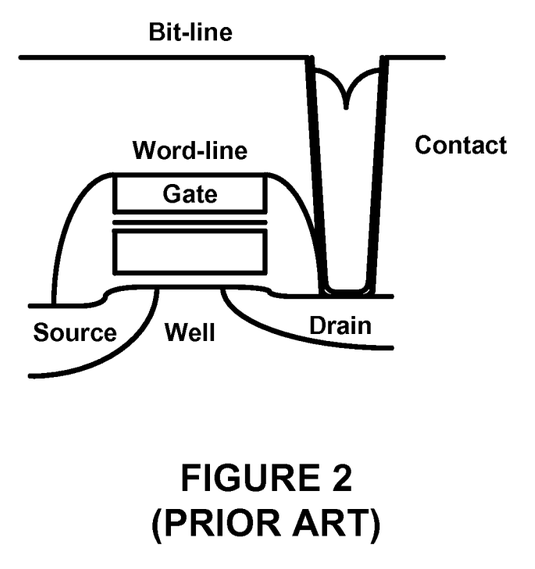
FIG. 2 shows a cross-sectional view of the floating gate transistor shown in FIG. 1.

A typical NOR flash memory cell includes a floating gate transistor as shown in FIGS. 1 and 2. The NOR flash memory cell has a relatively very narrow space between the gate and the drain. However, NOR flash memory devices use relatively high voltages with the memory cells for program and erase operations. In general, process defects located at the gate and drain of a floating gate transistor within a memory cell can easily induce programming failures, erasing failures, and/or some other malfunction. For this reason, semiconductor memory manufacturers usually perform several rounds of pre-cycle tests for the purpose of detecting and screening out as many of such defects as possible, with the goal of reducing failure rates before shipment. Since performing several rounds of pre-cycle tests incurs extra costs and reduces test capacity, a proper test method becomes an important issue for semiconductor memory manufacturers in order to try to balance quality and costs of semiconductor memory devices.

Thus, it is desirable to find new approaches for testing semiconductor memory devices that will allow for improved quality and/or reduction in costs associated with testing processes.

SUMMARY

Disclosed herein is a system and method for testing semiconductor memory devices. Using systems and methods disclosed herein, defects related to gate-to-drain shorts within a floating gate transistor of a semiconductor memory device can be detected and eliminated. For example, according to systems and methods described herein, one can easily detect potential cross defects between the gate (or word-line) and drain (or bit-line) of a transistor within a memory array, for example in a manufacturing environment where such defects can be eliminated before shipment so that test costs can be reduced and testing efficiency can be improved.

According to one aspect of the present disclosure, a method of testing a semiconductor memory device can comprise applying a first voltage to a first conductive line that is connected to a drain or source terminal of a transistor of a memory cell of the semiconductor memory device. The method also comprises applying a second voltage to a second conductive line that is connected to a gate of the transistor of the memory cell of the semiconductor memory device. The application of the first and second voltages is performed such that the first conductive line is at a higher voltage potential than the second conductive line. The method further comprises determining whether a defect is present in the semiconductor memory device based at least in part on a level of an electrical current in the second conductive line while the first and second voltages are applied to the respective conductive lines.

In some embodiments, the semiconductor memory device can be a NOR flash memory, while other embodiments can include other types of semiconductor memory devices, including, for example, NAND flash memory. In some embodiments, the first conductive line can be a bit-line and the second conductive line can be a word-line. Alternatively, the first and second conductive lines can include other combinations of conductive lines in a memory array. For example, the first and second conductive lines can be a global bit-line and a word-line, respectively, or a global bit-line and a global word-line respectively, or a bit-line and a global word-line, respectively.

In some embodiments, the higher voltage on the first conductive line can be achieved by applying a negative voltage to the second conductive line.

In some embodiments, the method involves detecting a gate-to-drain defect, for example a diode-plus-resistance type defect and/or a resistance type defect.

According to another aspect of the present disclosure, a semiconductor memory device can comprise a memory array that includes a memory cell, a first conductive line connected to the memory cell, and a second conductive line connected to the memory cell. The semiconductor memory device can also comprise circuitry for providing a positive voltage to the first conductive line, and for selectively providing either of a positive voltage and a negative voltage to the second conductive line. The circuitry can be configured to provide the negative voltage during a test procedure and provide the positive voltage during a read procedure.

In some embodiments, the circuitry can comprise a first input terminal for receiving a first control signal, a second input terminal for receiving a second control signal, and an output terminal for outputting an output voltage according to the first and second control signals. Some embodiments of such circuitry can further comprise a first transistor, a second transistor connected in series with the first transistor, and a third transistor connected in parallel with the first transistor, where the first and second transistors are connected to receive, at respective gates thereof, the first control signal, and the third transistor is connected to receive, at a gate thereof, the second control signal. The first transistor can be connected to receive a positive supply voltage at a source thereof, and the second transistor can be connected to receive a negative supply voltage at a source thereof.

In some embodiments, the test procedure can allow for detection of a leakage defect in the memory array between the first and second conductive lines.

According to yet another aspect of the present disclosure, a semiconductor memory device can comprise a memory array that includes a floating-gate transistor, a word-line connected to the gate of the floating-gate transistor, and a bit-line connected to the drain of the floating-gate transistor. The semiconductor memory device can also comprise circuitry for providing a positive voltage to the bit-line, and for selectively providing either of a positive voltage and a negative voltage to the word-line. The circuitry can be configured to provide the negative voltage during a test procedure and to provide the positive voltage during a read procedure.

In some embodiments, the circuitry can comprise a first input terminal for receiving a first control signal, a second input terminal for receiving a second control signal, and an output terminal for outputting an output voltage to the word-line according to the first and second control signals. Some embodiments of such circuitry can further comprise a first transistor, a second transistor connected in series with the first transistor, and a third transistor connected in parallel with the first transistor. The first and second transistors can be connected to receive, at respective gates thereof, the first control signal, and the third transistor can be connected to receive, at a gate thereof, the second control signal. The first transistor can be connected to receive a positive supply voltage at a source thereof, and the second transistor can be connected to receive a negative supply voltage at a source thereof.

In some embodiments, the test procedure can allow for detection of a leakage defect in the memory array between the bit-line and the word-line.

According to yet another aspect of the present disclosure, a method is disclosed for controlling a semiconductor memory device that comprises a memory array, the memory array including a memory cell, a first conductive line connected to the memory cell, and a second conductive line connected to the memory cell. The method can comprise applying a positive voltage to the first conductive line, and selectively applying one of a plurality of voltage levels to the second conductive line. At least one of the plurality of voltage levels is preferably less than the positive voltage applied to the first conductive line. The method further comprises detecting, while the first conductive line is at a greater voltage potential than the second conductive line, whether a defect is present in the semiconductor memory device based at least in part on a level of an electrical current in the second conductive line.

In some embodiments, the memory cell can comprise a transistor having a drain connected to the first conductive line, and a gate connected to the second conductive line. Thus, the application of the positive voltage to the first conductive line includes applying the positive voltage to the drain, and the selective application of one of the plurality of voltage levels to the second conductive line includes selectively applying one of the plurality of voltage levels to the gate.

In some embodiments, the detecting of whether a defect is present in the semiconductor memory device can include detecting whether a gate-to-drain defect is present in the semiconductor memory device, such as a diode-plus-resistance type of defect and/or a resistance type of defect.

BRIEF DESCRIPTION OF THE DRAWINGS

Features, aspects, and embodiments of the inventions are described in conjunction with the attached drawings, in which.

DETAILED DESCRIPTION

Figure 3:
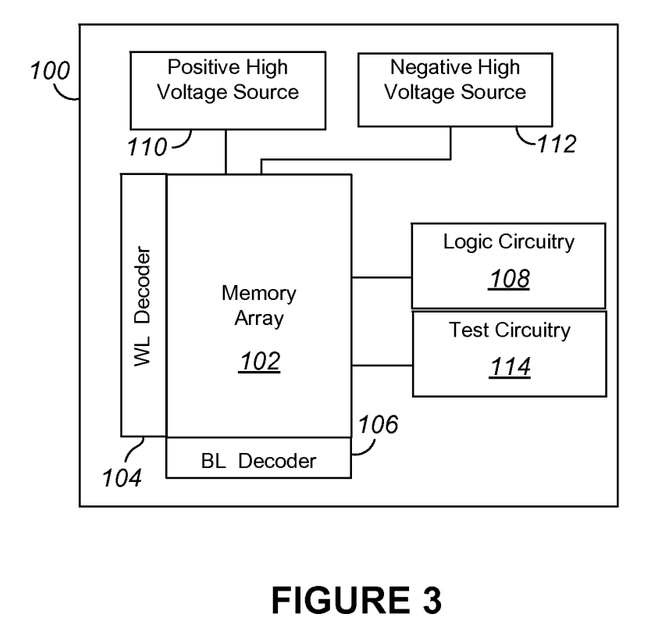
FIG. 3 shows a block diagram of a memory device 100 in accordance with an embodiment of the present disclosure.

FIG. 3 shows a block diagram of a memory device 100 in accordance with an embodiment of the present disclosure. The memory device 100 can include a memory array 102, a word-line (WL) decoder 104, and a bit-line (BL) decoder 106. The memory device 100 can also include logic circuitry 108 for user functions, for example read, program, and erase functions. The memory device 100 can also include a positive high-voltage source 110 and a negative high-voltage source 112, such as voltage pumping circuitry. The memory device 100 can further include test circuitry 114, described further in the description below.

Figure 4:
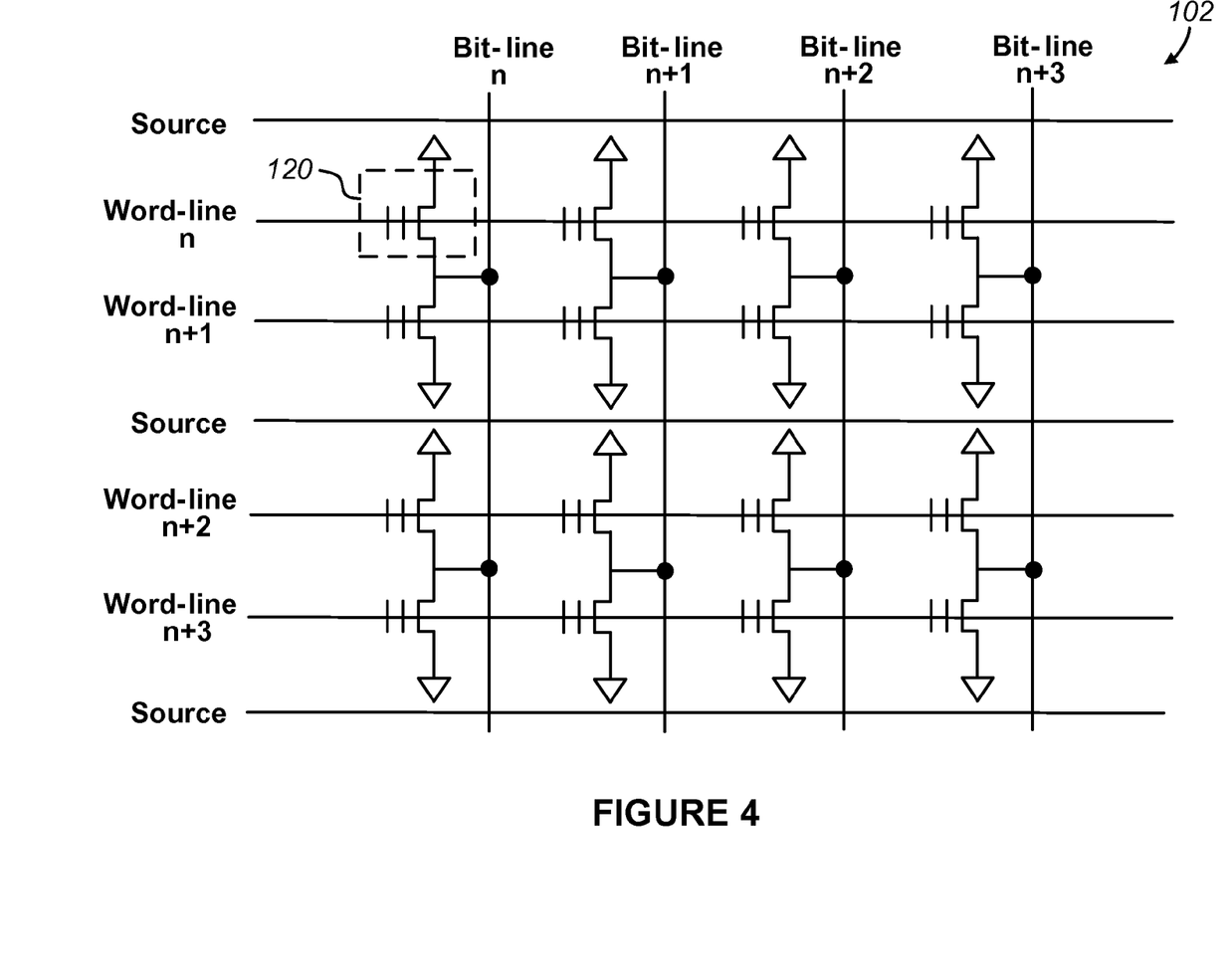
FIG. 4 shows a more detailed schematic diagram of an exemplary portion of the memory array shown in FIG. 3.

FIG. 4 shows a more detailed schematic diagram of an exemplary portion of the memory array 102. The memory array 102 includes a plurality of flash memory cells 120 arranged in a NOR flash architecture. The memory array 102 also includes a plurality of bit lines (Bit-line n through Bit-line n+3 being shown), a plurality of word lines (Word-line n through Word-line n+3 being shown), and a plurality of source lines, which allow for communication between the memory cells 120 and components of the memory device 100 that are outside of the memory array 102, such as WL decoder 104, BL decoder 106, logic circuitry 108, positive high-voltage source 110, negative high-voltage source 112, and test circuitry 114. Table 1 below shows a summary of voltage levels of a memory cell 120 for program, erase, and read operations.

TABLE 1

| Function | Control Gate (Word-line) | Drain (Bit-line) | Well | Source |
|---|---|---|---|---|
| Program | Positive High Voltage | Positive High Voltage | Ground | Ground |
| Erase | Negative High Voltage | Not Selected | Positive High Voltage | Not Selected |
| Read | Positive Voltage | ~1 V | Ground | Ground |

Figure 5:
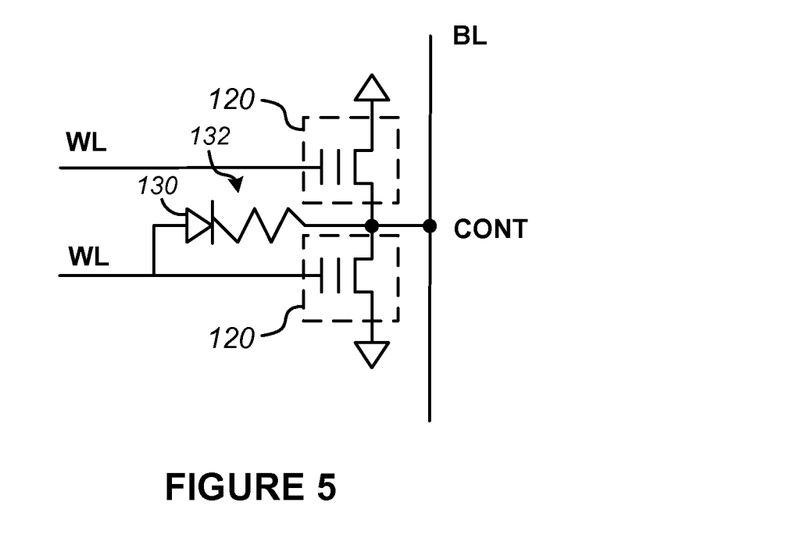
FIG. 5 shows a schematic view of a memory cell of the memory array shown in FIG. 4 having a diode-plus-resistance defect.
Figure 6:
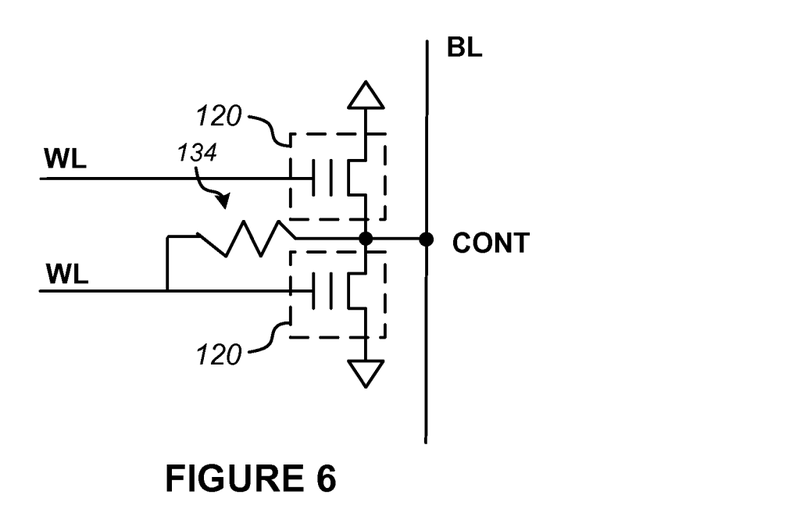
FIG. 6 shows a schematic view of a memory cell of the memory array shown in FIG. 4 having a resistance defect.

FIGS. 5 and 6 show examples of types of defects that can occur during the manufacturing of memory cells 120 of the memory array 102. FIG. 5 shows a defect referred to as "diode-plus-resistance" defect, while FIG. 6 shows a defect referred to as a resistive defect. Both defects involve an unwanted gate-to-drain leakage. In FIG. 5, the unwanted gate-to-drain leakage is shown symbolically as diode 130 in series with resistor 132, which together represent a short between drains of adjacent flash memory cells 120 and a word-line WL. In FIG. 6, the unwanted gate-to-drain leakage is shown symbolically as resistor 134, which represent a short between drains of adjacent flash memory cells 120 and a word-line WL. The test circuitry 114 can be configured to detect such gate-to-drain defects in a flash memory cell 120. Table 2 below shows a summary of voltage levels of a memory cell 120 under the control of test circuitry 114 for detecting such gate-to-drain defects in a flash memory cell 120.

TABLE 2

| Function | Control Gate (Word-line) | Drain (Bit-line) | Well | Source |
|---|---|---|---|---|
| Gate-to-Drain short detection | Negative Voltage | ~1 V | Ground | Ground |

As shown in Table 2, a test for detecting a gate-to-drain defect can include applying a negative voltage to the word-line of a memory cell, while applying a small positive voltage (e.g., ~1 volt) to the bit-line of the memory cell, while the well and source are set to ground level.

Figure 7:
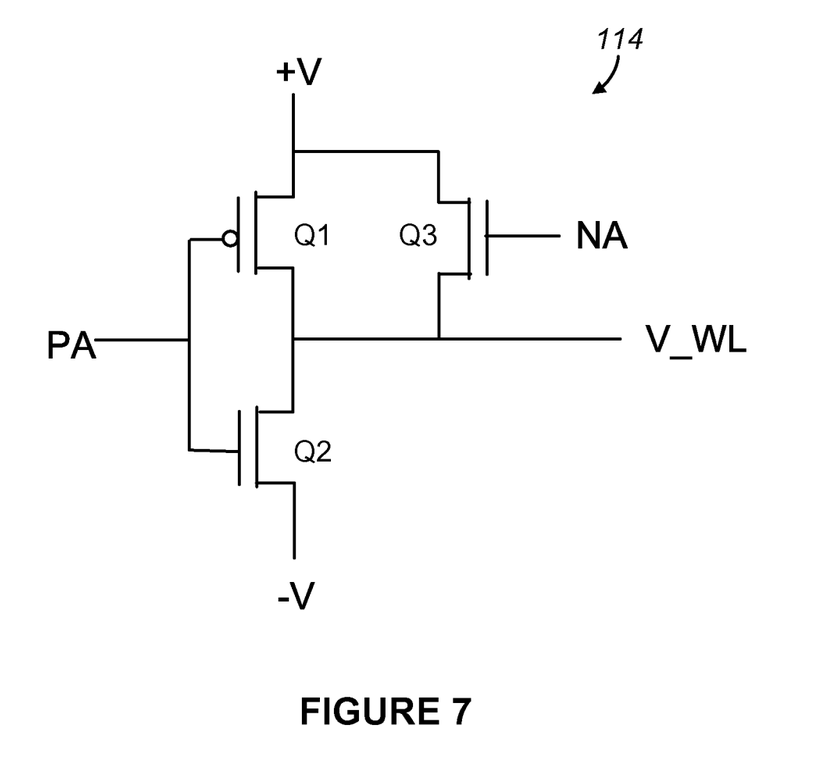
FIG. 7 shows a schematic view of a test circuit of the memory device shown in FIG. 3.

FIG. 7 shows a schematic diagram of an exemplary portion of the test circuitry 114. Actual implementations of the test circuitry 114 can include one of the circuits shown in FIG. 7 for each word-line of the memory device 100. The circuitry shown in FIG. 7 allows for the application of the negative voltage to the word-line for the gate-to-drain short detection summarized in Table 2.

The test circuitry 114 includes a PMOS transistor Q1, an NMOS transistors Q2 and Q3. The transistor Q1 is connected in series with the transistor Q2 between a positive supply voltage +V and a negative supply voltage −V. More specifically, the source of transistor Q1 is connected to the positive supply voltage +V, while the source of transistor Q2 is connected to the negative supply voltage −V. The gates of transistors Q1 and Q2 are connected to a first input terminal that receives a first control signal PA. The drains of transistors Q1 and Q2 are connected together and to an output terminal that supplies an output voltage V_WL, which can be provided to a word-line of the memory array 102.

The transistor Q3 is connected in parallel with the transistor Q1. More specifically, the drain of the transistor Q3 is connected to the positive supply voltage +V, and the source of the transistor Q3 is connected to the output terminal and to the drains of transistors Q1 and Q2. The gate of the transistor Q3 is connected to a second input terminal that receives a second control signal NA.

The test circuitry 114 shown in FIG. 7 can be special operating circuitry that can be operated to output an adjustable output voltage V_WL. The circuitry 114 can output either a positive voltage, which can be used for a read operation, or a negative voltage, which can be used for a test operation, depending on the values of the first and second control signals PA and NA. Table 3 below shows a summary of voltage levels at the input and output terminals of the circuitry 114 for providing either a positive (READ) or negative (TEST) output voltage as the signal V_WL.

TABLE 3

| Operation | +V | −V | PA | NA | V_WL |
|---|---|---|---|---|---|
| READ | positive voltage | GND | L | H | positive voltage |
| TEST | positive voltage | Negative voltage | H | L | negative voltage |

Figure 8:
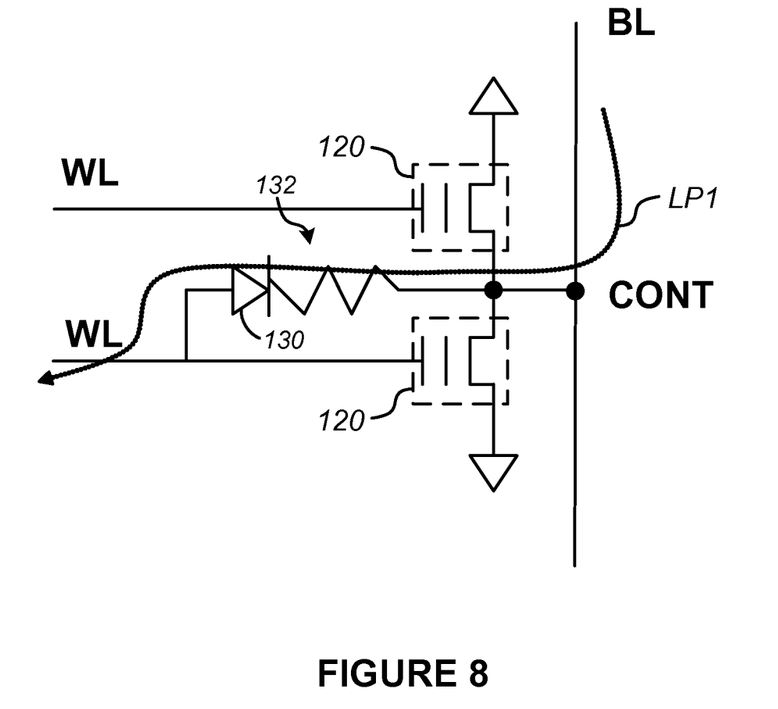
FIG. 8 shows a schematic view of the memory cell shown in FIG. 5 having a diode-plus-resistance defect, illustrating a leakage current path thereof.
Figure 9:
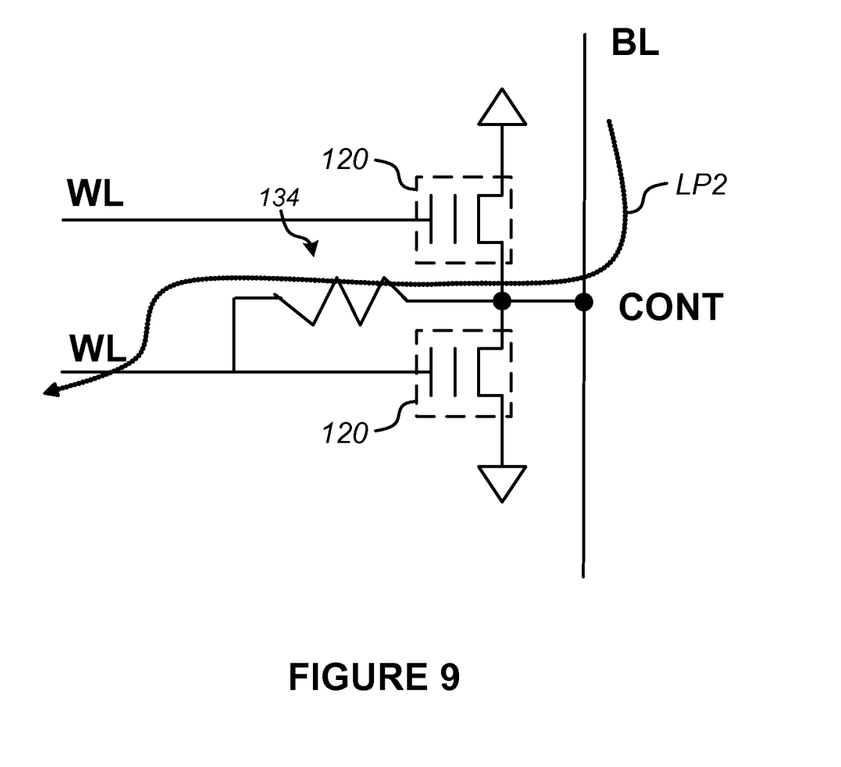
FIG. 9 shows a schematic view of a memory cell shown in FIG. 6 having a resistance defect, illustrating a leakage current path thereof.

According to a preferred embodiment, the test circuitry 114 is operated to provide a negative voltage V_WL (relative to the voltage level of the bit-line voltage) as a word-line voltage in order to detect a gate-to-drain defect, such as those shown in FIGS. 5 and 6. FIGS. 8 and 9 show schematic diagrams illustrating how the test operation using the negative word-line WL voltage can effectively detect gate-to-drain short faults in a memory array such as the memory array 102.

Referring to FIG. 8, the application of a relatively negative voltage level to the word-line WL, as compared to the voltage level of the bit-line BL, by the test circuitry 114 can reveal a diode-plus-resistance defect as described in connection with FIG. 5. The arrow LP1 shows the leakage path that allows for current leakage due to the presence of the diode-plus-resistance defect. The applied negative word-line WL voltage can cause electrical current to flow along the leakage path LP1. The resulting current, which would be indicative of the presence of the diode-plus-resistance defect, can be calculated according to Expression 1:

$$I_{WL} = \frac{V_{BL} - V_{WL} - V_{th}}{R} \quad (1)$$

In Expression 1, $I_{WL}$ is the word-line current, $V_{BL}$ is the bit-line BL voltage, $V_{WL}$ is the word-line WL voltage, $V_{th}$ is the diode defect threshold voltage of the diode defect 130, and R is the resistance of the defect resistance 132.

As a specific example, a voltage $V_{BL}$ of 1 volt can be applied to the bit-line BL, while a negative $V_{WL}$ voltage of −3 volts is applied to the word-line WL. As a result, the relative voltage of the bit-line BL is 4 volts higher than the word-line WL. So, for example, for a diode defect 130 having a diode defect threshold voltage $V_{th}$ of 2 volts and a resistance defect of about 200 KOhms, a current of about 10 μAmps on the word-line WL would indicate the presence of the diode-plus-resistance defect shown in FIG. 8. Similarly, a current of about 5 μAmps on the word-line WL would indicate the presence of the diode-plus-resistance defect that includes a diode defect 130 having a diode defect threshold voltage $V_{th}$ of 3 volts and a resistance defect of about 200 KOhms. On the other hand, if there is no gate-to-drain defect, then there will be no current on the word-line WL.

Referring next to FIG. 9, the application of a relatively negative voltage level to the word-line WL, as compared to the voltage level of the bit-line BL, by the test circuitry 114 can also reveal a resistance defect as described in connection with FIG. 6. The arrow LP2 shows the leakage path that allows for current leakage due to the presence of the resistance defect. The applied negative word-line WL voltage can cause electrical current to flow along the leakage path LP2. The resulting current, which would be indicative of the presence of the resistance defect, can be calculated according to Expression 2:

$$I_{WL} = \frac{V_{BL} - V_{WL}}{R} \quad (2)$$

In Expression 2, $I_{WL}$ is the word-line current, $V_{BL}$ is the bit-line BL voltage, $V_{WL}$ is the word-line WL voltage, and R is the resistance of the defect resistance 134.

As a specific example, a voltage $V_{BL}$ of 1 volt can be applied to the bit-line BL, while a negative $V_{WL}$ voltage of −3 volts is applied to the word-line WL. As a result, the relative voltage of the bit-line BL is 4 volts higher than the word-line WL. So, for example, for a resistance defect of about 500 KOhms, a current $I_{WL}$ of about 8 μAmps on the word-line WL would indicate the presence of the resistance defect shown in FIG. 9. Similarly, application of a negative $V_{WL}$ voltage of −8 volts on the word-line WL would result in a current $I_{WL}$ of about 18 μAmps on the word-line WL in the presence of the resistance defect of about 500 KOhms. On the other hand, if there is no gate-to-drain defect, then there will be no current on the word-line WL.

The disclosed testing system and method is also effective for detecting process defects that induce leakage between various conductive lines, such as between word-line and bit-line, between word-line and global bit-line, between global word-line to global bit-line, and between global word-line to bit-line. For various manufacturing defects, such as a diode defect, resistance defect, or hybrid defect, a proper level of negative high voltage for detecting gate-to-drain leakage can be chosen by one skilled in the art for suitably magnifying the amount of leakage current by applying a suitably larger voltage difference.

The time required for testing a sector (or block) unit of memory can be significantly reduced by supplying an adjustable negative voltage to all word-lines of the individual sector (or block) unit of the memory while reading the memory array. Using such an arrangement, a gate-to-drain defect anywhere within the sector (or block) unit of the memory can be detected by reading one word line of the individual sector (or block) unit.

The disclosed test system and method are not restricted to the application of NOR flash, but can also be applied to any other memory, for example, NAND flash memory.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor memory device, comprising:
   a memory array that includes a memory cell, a first conductive line connected to the memory cell as a bit-line, and a second conductive line connected to the memory cell as a word-line;
   a circuitry that
      provides a positive voltage to the first conductive line during a read procedure,
      selectively provides a positive voltage or a negative voltage to the second conductive line, and
      tests the memory cell, the test of the memory cell including providing the negative voltage to the memory cell.

2. The semiconductor memory device of claim 1, wherein the circuitry includes:
   a first input terminal that receives a first control signal;
   a second input terminal that receives a second control signal; and
   an output terminal that outputs an output voltage according to the first and second control signals.

3. The semiconductor memory device of claim 2, wherein the circuitry includes:
   a first transistor including a gate that receives the first control signal;
   a second transistor connected in series with the first transistor, the second transistor including a gate that receives the first control signal; and
   a third transistor connected in parallel with the first transistor, the third transistor including a gate that receives the second control signal.

4. The semiconductor memory device of claim 3, wherein the first transistor includes a source that receives a positive supply voltage, and
   the second transistor includes a source that receives a negative supply voltage.

5. The semiconductor memory device of claim 1, wherein the test detects a leakage defect in the memory array between the first and second conductive lines.

\* \* \* \* \*